(12) United States Patent
Mohanakrishnaswamy et al.

(10) Patent No.: US 8,022,491 B2
(45) Date of Patent: Sep. 20, 2011

(54) HIGH ASPECT RATIO ALL SIGE CAPACITIVELY COUPLED MEMS DEVICES

(75) Inventors: Venkatesh Mohanakrishnaswamy, Coppell, TX (US); Loi N. Nguyen, Carrollton, TX (US)

(73) Assignee: STMicroelectronics, Inc., Coppell, TX (US)

(*) Notice: Subject to any disclaimer, the term of this patent is extended or adjusted under 35 U.S.C. 154(b) by 90 days.

(21) Appl. No.: 12/495,610

(22) Filed: Jun. 30, 2009

(65) Prior Publication Data

US 2010/0164024 A1 Jul. 1, 2010

Related U.S. Application Data

(60) Provisional application No. 61/142,113, filed on Dec. 31, 2008.

(51) Int. Cl.
  *H01L 29/84* (2006.01)
(52) U.S. Cl. .............. 257/415; 257/E29.324; 438/52
(58) Field of Classification Search ........... 257/415, 257/416, E29.324; 438/50, 52
See application file for complete search history.

(56) References Cited

U.S. PATENT DOCUMENTS

| 6,952,041 | B2 * | 10/2005 | Lutz et al. | 257/415 |
| 7,172,917 | B2 * | 2/2007 | Partridge et al. | 438/50 |
| 7,838,952 | B2 * | 11/2010 | Inaba et al. | 257/415 |
| 2010/0032812 | A1 * | 2/2010 | Sedky et al. | 257/631 |

* cited by examiner

*Primary Examiner* — Matthew Smith
*Assistant Examiner* — Daniel Shook
(74) *Attorney, Agent, or Firm* — David V. Carlson; Lisa K. Jorgenson

(57) ABSTRACT

A method that includes forming an opening between at least one first electrode and a second electrode by forming a recess in a first electrode layer, the recess having sidewalls that correspond to a surface of the at least one first electrode, forming a first sacrificial layer on the sidewalls of the recess, the first sacrificial layer having a first width that corresponds to a second width of the opening, forming a second electrode layer in the recess that corresponds to the second electrode, and removing the first sacrificial layer to form the opening between the second electrode and the at least one first electrode.

26 Claims, 15 Drawing Sheets

HIGH ASPECT RATIO ALL SIGE CAPACITIVELY COUPLED MEMS DEVICES

BACKGROUND

1. Technical Field

The present disclosure relates generally to micro electromechanical systems, and more particularly to forming at least one suspended electrode and a second electrode separated by a submicron opening.

2. Description of the Related Art

Micro electro-mechanical systems (MEMS) in semiconductors have arisen for various applications such as to sense temperature, pressure, strain, acceleration, rotation, and chemical properties of liquids and gases. Those MEMS structures are usually combined with other integrated circuits, such as complimentary metal oxide semiconductor (CMOS) circuits, for analyzing and calculating the parameters sensed by MEMS. Therefore, the MEMS manufacturing processes are required to be compatible with the existing MOS or CMOS manufacturing processes such that the whole system is inexpensive, reliable, and compact.

Various MEMS structures and materials have been proposed and developed for such sensing purposes. Sensing may be accomplished by capacitively coupled electrodes separated by an air gap. As one or both of the electrodes move relative to the other electrode a fluctuation in the capacitive air gap results in a change in the capacitance. The sensitivity of capacitively coupled electrodes increases as a distance between the electrodes is reduced. Device performance may also be improved by maximizing a ratio of a surface area of the electrodes to the distance between two electrodes.

Alternatively, the sensitivity of the capacitively coupled electrodes may be varied by changing dimensions and area of the material used to form the electrodes. This is accomplished by changing the surface area, the width, the length, or the height of the MEMS structure to modify the device performance.

Currently inertial sensors and other capacitively coupled electrodes are typically silicon based, such as polysilicon, bulk silicon, or epitaxially grown silicon.

BRIEF SUMMARY

A high aspect ratio MEMS device with very small spaces between adjacent structures having precise distances with tight tolerances is provided in one inventive embodiment. MEMS structures are relatively tall, usually in the range of 20 microns. The space between them can be formed on the order of 10 nanometers or less, or a ratio of over 1000 to 1 for the height to distance.

According to one of the methods of the present invention, one member of a MEMS structure, such as the anchor, is first formed. An aperture is then etched in the MEMS structure providing a through hole to a base layer. Sidewalls are then grown to a precise thickness on the MEMS structure. The thickness of the sidewalls can be exactly controlled within tight tolerances using standard oxide growth on silicon, which is a well-known process. The oxide is formed by an acceptable method, either growth or deposition, with growth being preferred because it can be precisely controlled using known processes. When the oxide has grown to a desired thickness, an electrode layer is formed in the aperture, either by deposition, epitaxial growth, or pseudo-epitaxial growth.

The sidewall oxide, together with other oxides, is then etched away as a sacrificial oxide to release the formed silicon layer in the aperture that forms the resonator. Accordingly, the distance between the resonator and the electrode can be precisely controlled to a very small distance with tight tolerances.

The present disclosure describes a method that includes forming an opening between at least one first electrode and a second electrode, the forming including forming a recess in a first electrode layer, the recess having sidewalls that correspond to a surface of the at least one first electrode; forming a first sacrificial layer on the sidewalls of the recess, the first sacrificial layer having a first width that corresponds to a second width of the opening; forming a second electrode layer in the recess that corresponds to the second electrode; and removing the first sacrificial layer to form the opening between the second electrode and the at least one first electrode.

By incorporating other materials into the electrodes, devices having different flexibility, hardness and strength from silicon, the spring constant can change without requiring a change in the physical size or shape. For example, germanium is elastic and can change the flexibility of a sensing body without varying the physical structure. More particularly, silicon germanium may be used to affect the Young's Modulus of the electrode and can, therefore, affect the sensitivity of the electrode without increasing the area or decreasing the distance.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

Figure 1:
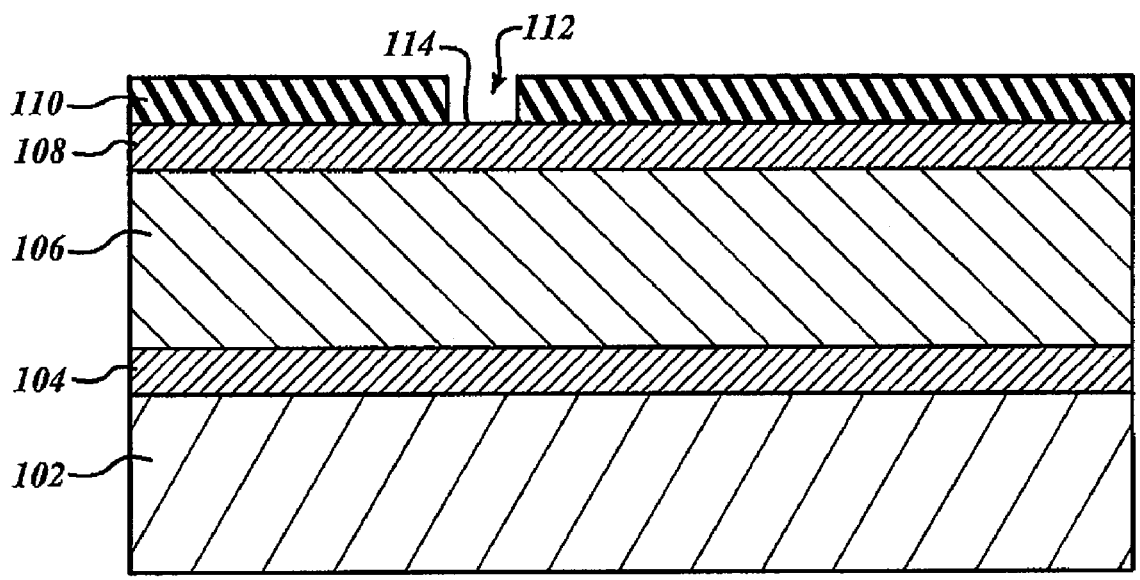
FIGS. 1-10 are cross-sectional views of different stages of a manufacturing process of forming a first electrode and a second electrode separated by an opening.

In the following description, certain specific details are set forth in order to provide a thorough understanding of various embodiments of the disclosure. However, one skilled in the art will understand that the disclosure may be practiced without these specific details. In other instances, well-known structures associated with MEMS components and semiconductor fabrication have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

In the drawings, identical reference numbers identify similar elements or acts. The size and relative positions of elements in the drawings are not necessarily drawn to scale.

Figure 8:
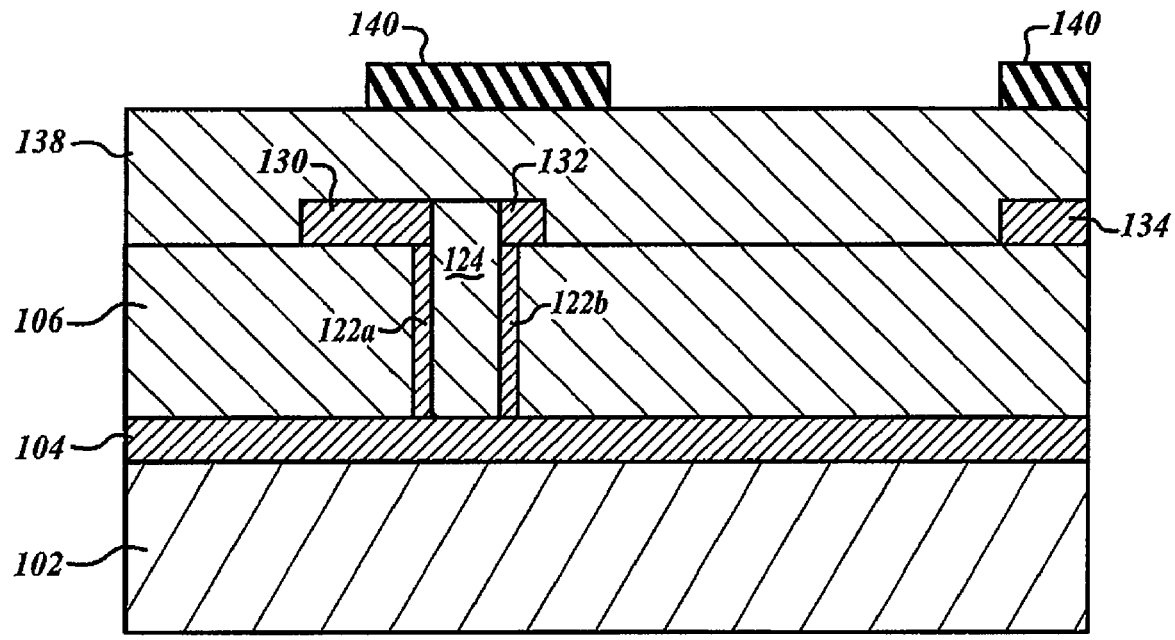
Figure 9:
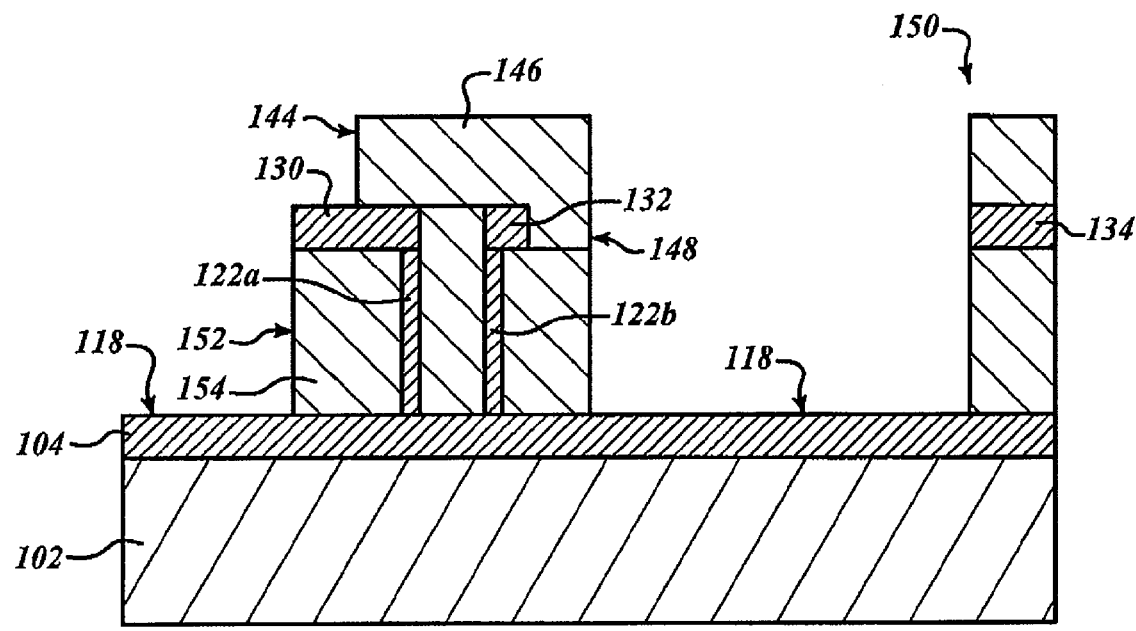
Figure 10:
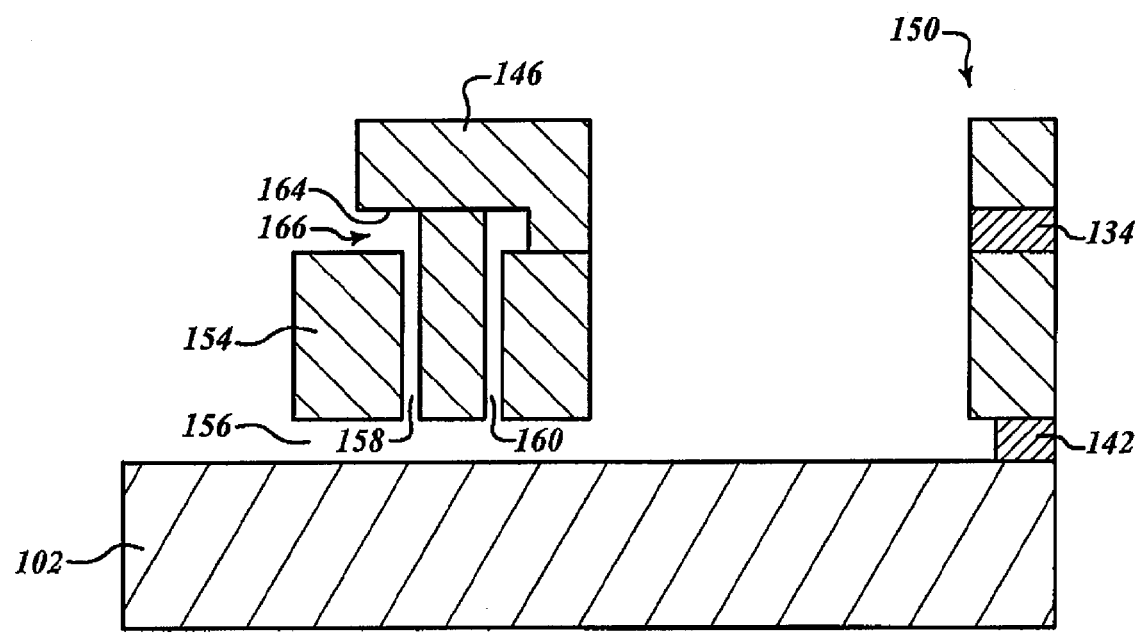

FIGS. 1-10 illustrate a manufacturing process for forming a high aspect ratio capacitively coupled MEMS device having a first suspended electrode 154 separated from a second movable electrode 146 by an opening 158 (see FIG. 10). The width of the opening 158 can be precisely controlled on the order of tens of nanometers. Further, the width can be any selected value in the range of 10 to 200 nanometers with a range between 20 and 100 nanometers being preferred, 50 nanometers being common. The reduced width of the opening 158 can result in the ability to decrease in the application voltage of the MEMS device, which makes the device compatible with sub-100 nanometer CMOS technology nodes. A method of making the device will now be described.

FIG. 1 illustrates a substrate 102 that may be formed of monocrystalline semiconductor material such as silicon. The substrate 102 may be doped with a desired conductivity type, either P-type or N-type. A first sacrificial layer 104 is deposited or grown on the substrate 102. The first sacrificial layer 104 may be a thermal oxide, such as silicon dioxide, tetra ethyl ortho silicate (TEOS), borophosphosilicate glass (BPSG), spin-on glass, poly germanium or any suitable sacrificial layer that is removable later in the process. A plasma etch chemical vapor deposition (PECVD) technique may be used to deposit the first sacrificial layer 104. In one embodiment, the first sacrificial layer 104 has a thickness in the range of one to two microns.

Subsequently, a first electrode layer 106 is deposited conformally over the first sacrificial layer 104. The first electrode layer 106 may have a thickness of 20 microns or more depending on the device features. The thickness of the first electrode layer 106 corresponds to a desired height of the suspended electrode 154 in FIG. 10. The height also determines a surface area of the suspended electrode 154 that is capacitively coupled to the second electrode 146 in FIG. 10. The ratio of the surface area to the width of the opening 158 between the two electrodes also affects the capacitive coupling of the electrodes, the equation for a capacitor being well known:

$$C = k\frac{A}{d},$$

wherein A is the area of the plates and d is the distance between them, and k is a constant that includes the dielectric constant of the material between the plates.

Capacitively coupled electrodes may be utilized in a variety of applications, such as accelerometers, temperature and pressure sensors, and gyroscopes. For example, the suspended electrode 154 may be configured to deflect in response to an acceleration force. The second electrode 146 detects a change in the capacitance between the two electrodes and through appropriate circuitry can signal the detected acceleration force.

More particularly, the suspended electrode 154 may be manufactured to respond, i.e., deflect, when it experiences a predetermined acceleration force. This may be achieved by selecting a particular size for the suspended electrode 154 and by utilizing a specific material. Silicon germanium is a material that (SiGe) can be deposited in a variety of atomic percentages that can be carefully controlled to produce different mechanical properties. SiGe has excellent crystalline structure and is compatible with current semiconductor etchants.

The first electrode layer 106, portions of which will correspond to the suspended electrode 154, may be formed of SiGe of a first relative atomic percentage. An epitaxial film SiGe may be deposited using chemical vapor deposition (CVD). The crystalline structure of the underlying material onto which the SiGe forms determines the crystalline structure of the SiGe. For example, when deposited on a non-crystalline material the SiGe will form as a polycrystalline structure.

A reaction between silane (SiH4), germane (GeH4), and a reducing gas, such as hydrogen, may create the first electrode layer 106 of SiGe. A flow rate of the reducing gas determines the atomic percentage of silicon to germanium. The relative atomic percentage of SiGe affects the Young's Modulus, i.e., the stiffness of the suspended electrode 154, which in turn affects the sensitivity of the capacitively coupled electrode.

Varying the atomic percentage of silicon to germanium creates different mechanical properties in the resulting structure. Since germanium is more elastic than silicon, incorporating some percentage of germanium with silicon for the electrodes will change the flexibility of the device without having to change the mechanical or physical structure of the electrode. If the resulting structure is a resonant structure, particular spring constants may be achieved by selecting the atomic percentage of the silicon to germanium. By using SiGe, resonating MEMS devices of similar size may be produced that have different resonant frequencies and varying sensitivity.

Advantageously, layers of SiGe form at lower temperatures than polysilicon or bulk silicon. Therefore, when forming a MEMS device with integrated circuits, the electrodes, i.e., sensing bodies, may be formed after formation of the integrated circuits. The lower formation temperatures of SiGe make it is easier to form MEMS devices with integrated circuits by avoiding problems such as delamination.

A second sacrificial layer 108 is deposited overlying the first electrode layer 106. The second sacrificial layer 108 may be formed of the same material as the first sacrificial layer or may be an alternative material that is removable later in the process. In addition, the second sacrificial layer 108 may be deposited at a similar thickness to the first sacrificial layer 104, for example in the range of 1 to 2 microns.

Figure 2:
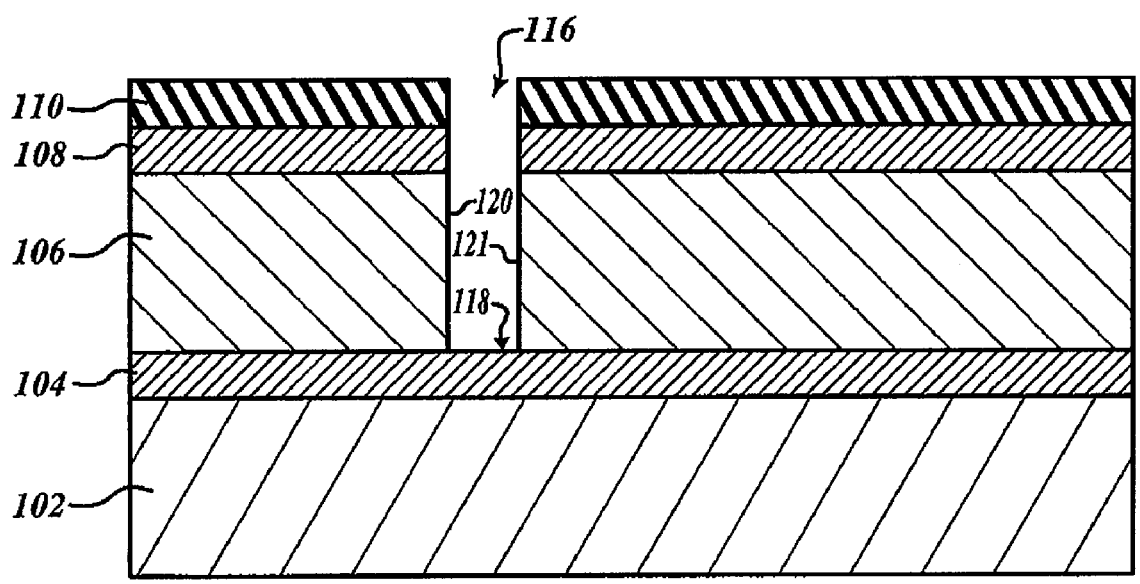

A photoresist layer 110 is deposited and patterned to form an opening 112 that exposes a top surface 114 of the second sacrificial layer 108. As shown in FIG. 2, the opening 112 defines contours of a recess 116 formed through the second sacrificial layer 108 and the first electrode layer 106. The second sacrificial layer 108 acts as a hard mask as the first electrode layer 106 is etched. The recess 116 exposes a top surface 118 of the first sacrificial layer 104 and has walls 120, 121 defined by the first electrode layer 106. In one embodiment, a ratio between the thickness of the first electrode layer 106 and a width of the recess 116 is 5:1. In other embodiments, the ratio is 10:1, FIG. 2 not being shown to an exact scale. After forming the recess 116, the photoresist layer 110 is removed.

Figure 3:
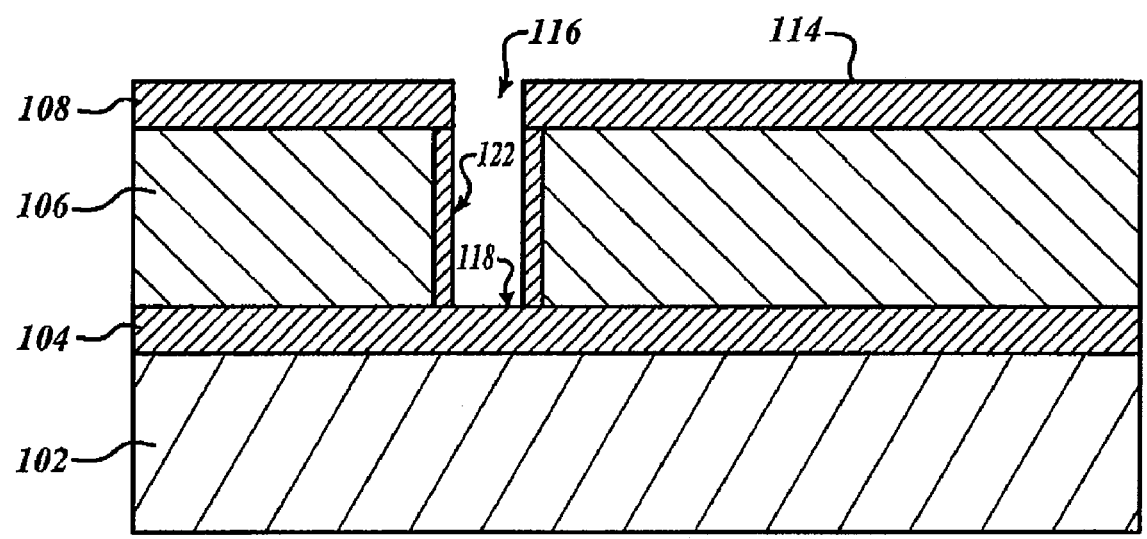

FIG. 3 shows a formation of a third sacrificial layer 122 adjacent the walls 120, 121 of the first electrode layer 106. Two portions of layer 122 are formed on the sidewalls, labelled 122a and 122b. A thickness of the third sacrificial layer 122 may be controlled to optimize performance of the final MEMS device. The thickness of the layer 122 will determine the width of the opening 156 between the first suspended electrode 154 and the second electrode 146. For example, the width may be in the range of 10 to 100 nanometers. In one embodiment, a ratio of the thickness of the first electrode layer 106 to the width of the third sacrificial layer 122 is 400:1, i.e., 20 microns:50 nanometers.

Figure 20:
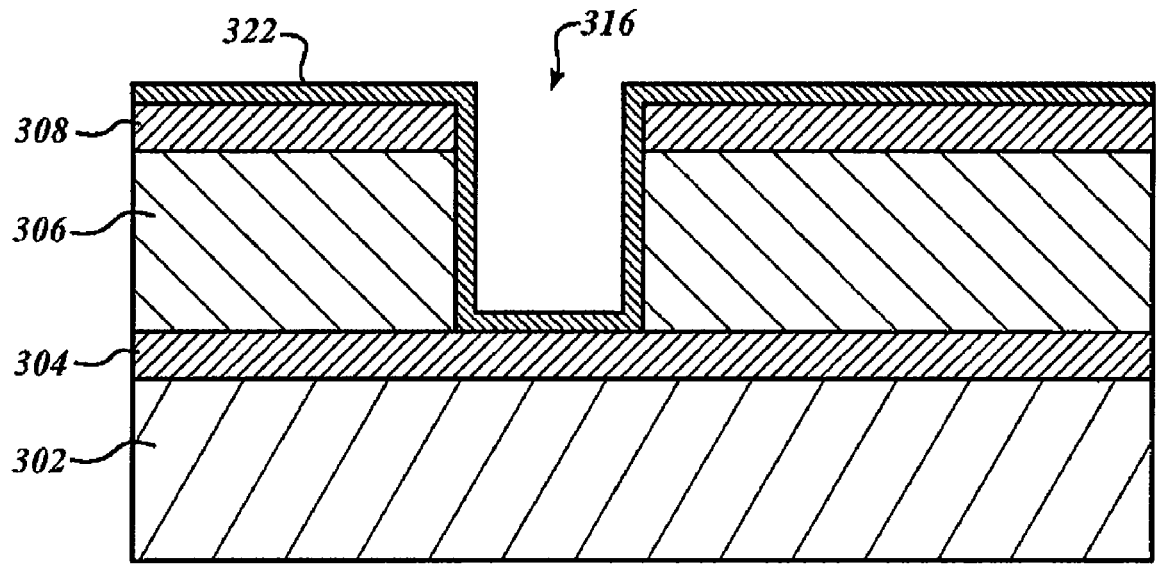

The third sacrificial layer 122 may be grown or deposited. In FIG. 3, the third sacrificial layer 122 is illustrated as consuming portions of the exposed walls 120, 121 of the first electrode layer 106 as it is grown. Growing is preferred if the layer is a silicon dioxide since the thickness can be precisely controlled and will be uniform along the entire wall. Although surfaces of the third sacrificial layer 122 are illustrated as in line with the boundaries of opening 112 in the second sacrificial layer 108, some of the third sacrificial layer 122 may extend into the recess. However, the width of the sacrificial layer 122 does not significantly affect the width of the recess 116. Alternatively, FIG. 20 illustrates the third sacrificial layer as conformally deposited.

If the third sacrificial layer 122 is a grown oxide, the first and second sacrificial layers 104 and 108 may incidentally grow. Generally, exposed surfaces of oxides will grow along the interface of the sacrificial layer and an adjacent layer. For example, when growing the third sacrificial layer 122 the first sacrificial layer 304 will grow along the interface with the substrate 302. The thickness of the grown layers may be selected to achieve the desired purpose and any incidental growth may be accounted for prior to growing the sacrificial layers.

Figure 4:
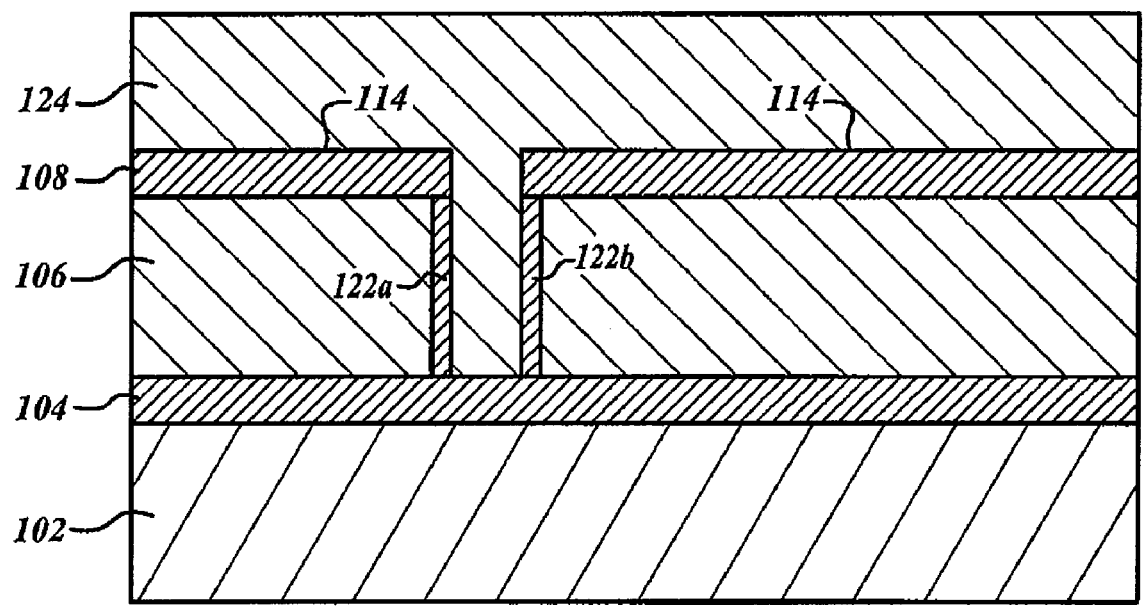

In FIG. 4, a second electrode layer 124 is deposited in the recess 116 and overlies the top surface 114 of the second sacrificial layer 108. The second electrode layer 124 may be formed of the same material or a different material as the first electrode layer 106. In the embodiment where the first electrode layer 106 is SiGe, the second electrode layer 124 may also be SiGe. The atomic percentage of silicon to germanium of the second electrode 124 may be the same or different from the atomic percentage of the first electrode 106. In addition, the atomic percentage of the second electrode 124 may vary through the deposited SiGe. For example, the second electrode layer 124 may have a first atomic percentage adjacent the top surface 118 of the first sacrificial layer 104 and have a second atomic percentage adjacent the top surface 114 of the second sacrificial layer 108.

In the formula $S_{1-x}Ge_x$, the value of x can be varied for different layers and for different parts of each layer. Ge has a Young's modulus of elasticity that is lower than that of silicon, on the range of 30% to 50% lower, depending on the plane orientation. Accordingly, as the ratio of Ge to Si is varied, the flexibility and thus the responsiveness of the resonator varies. In some embodiments, a ratio of 15% Ge to 85% Si is desired. In other embodiments, percentages of Ge may range from 20% to 50%, with a ratio of about 20% being preferred in some embodiments.

Figure 5:
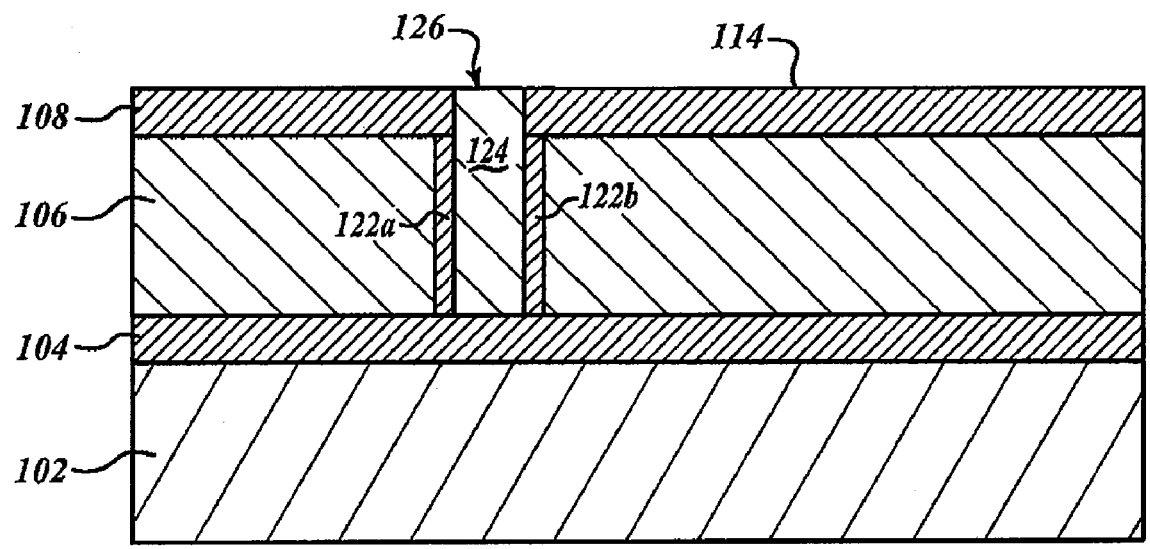

In FIG. 5, the second electrode layer 124 is subsequently planarized by chemical mechanical planarization (CMP) to re-expose the top surface 114 of the second sacrificial layer 108. The CMP forms a top surface 126 of the second electrode layer 124 that is in the same plane as the top surface 114 of the second sacrificial layer 108.

Figure 6:
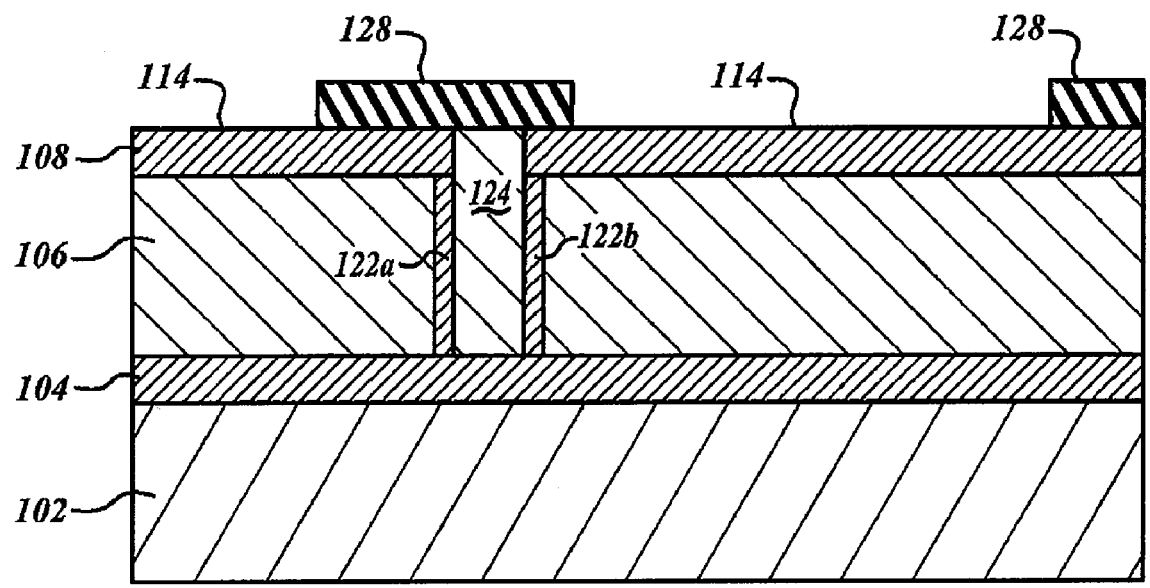
Figure 15:
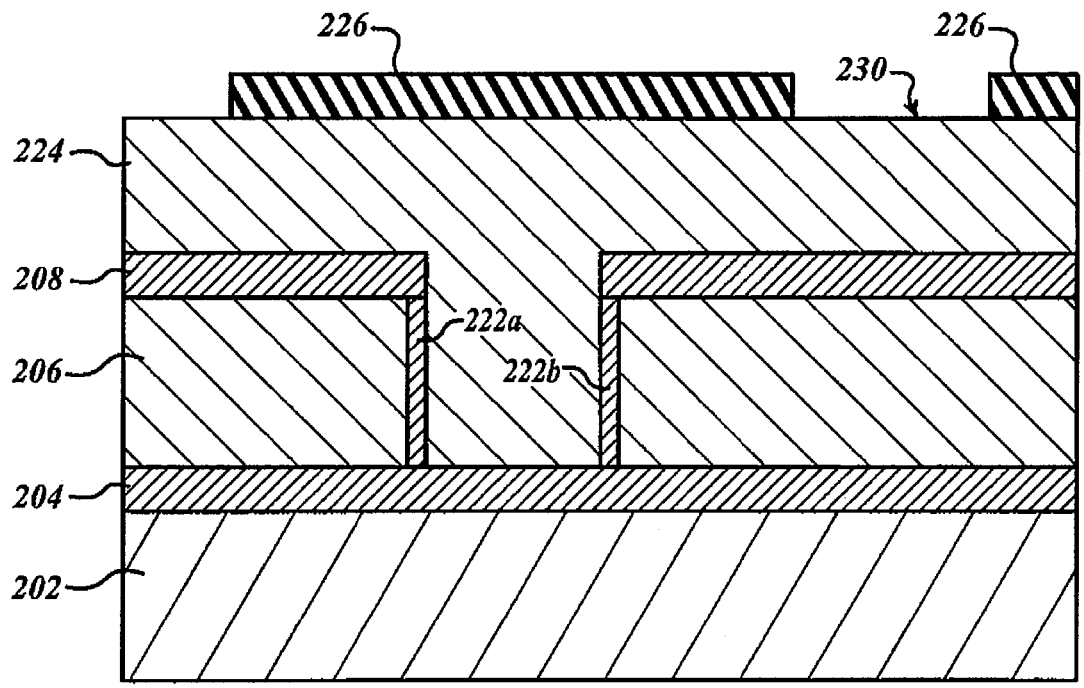
Figure 23:
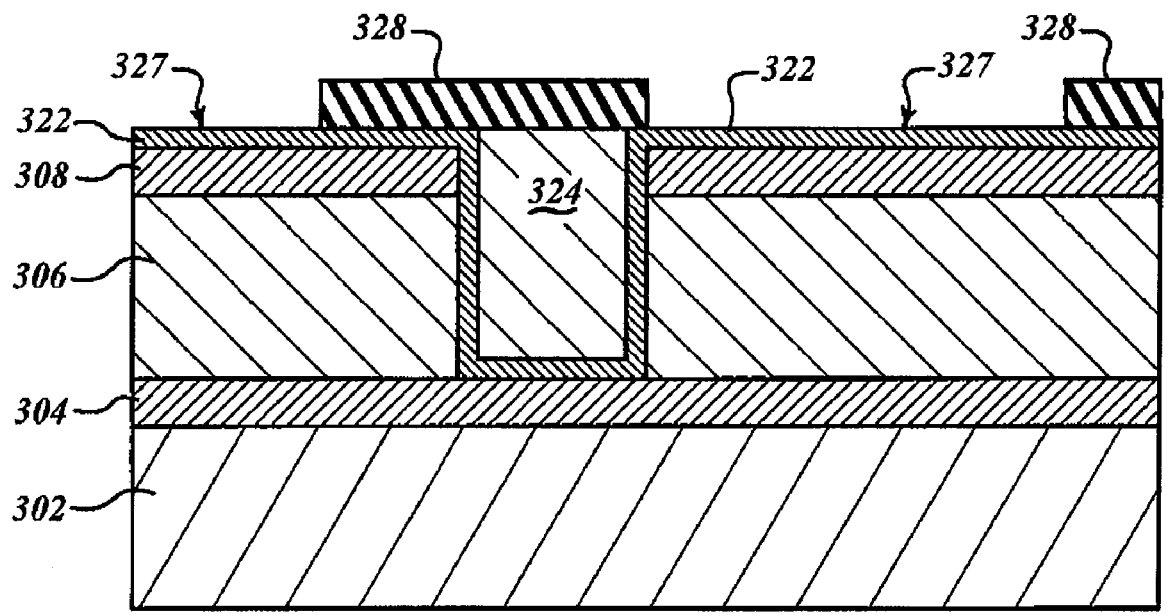

Subsequently as shown in FIG. 6, a second photoresist layer 128 is deposited and patterned over the second sacrificial layer 108. The pattern of the photoresist layer 128 corresponds to selected portions of the second sacrificial layer 108 that will remain after removal of the portions of the second sacrificial layer 108 that are exposed. The pattern corresponds to a width of the first suspended electrode 154 and anchor portion 150. The pattern may be varied to meet design requirements of the MEMS device. Alternative photoresist patterns are shown in FIGS. 15 and 23.

Figure 7:
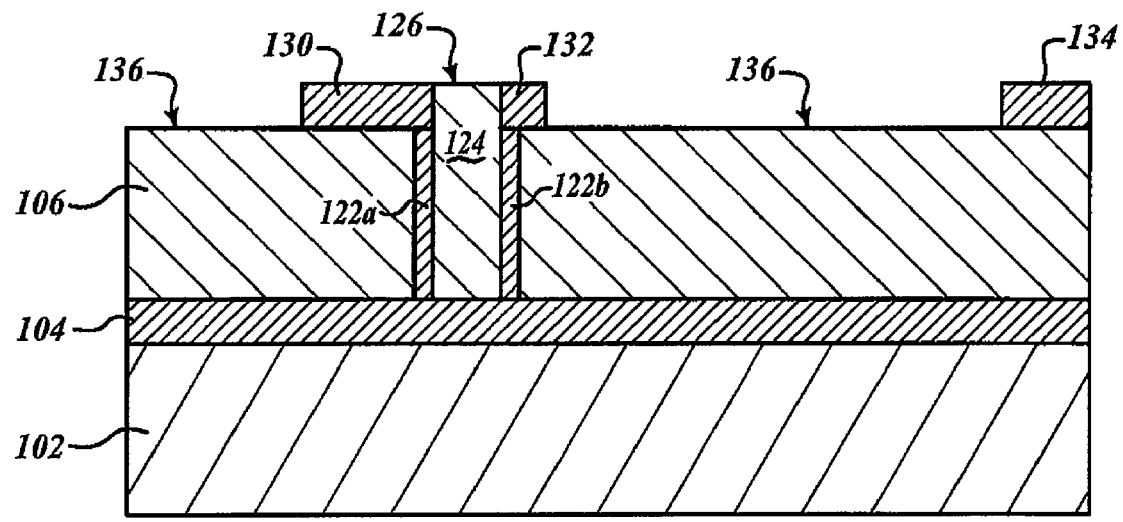

As shown in FIG. 7, a first portion 130, a second portion 132, and a third portion 134 of the second sacrificial layer 108 correspond to the pattern of the photoresist layer 128. These portions 130, 132, and 134 remain after the exposed portions the second sacrificial layer 108 are removed by a suitable etch technique. The first portion 130, the second portion 132, and the third portion 134 correspond to boundaries of the first suspended electrode 154, the second electrode 156, and the anchor portion 150, respectively. The photoresist layer 128 is removed after etching the second sacrificial layer 108.

A top surface 136 of the first electrode layer 106 is exposed by removing the exposed portions of the second sacrificial layer 108. If the second sacrificial layer 108 is silicon dioxide, TEOS, or BPSG, for example a hydrogen fluoride etch may be used to remove the portions. If polygermanium is used as the sacrificial layer, $H_2O_2$ is a suitable release etchant.

In FIG. 8, a third electrode layer 138 is deposited overlying the exposed top surface 136 of the first electrode layer 106 and the first portion 130, second portion 132, and third portion 134 of the second sacrificial layer 108. The third electrode layer 138 may also be formed of SiGe. Based on the desired device functionality, the manufacturer or designer may select different atomic SiGe percentages for first electrode layer 106, the second electrode layer 124, and the third electrode layer 138. Alternatively, two or more of the electrode layers may be of the same atomic percentage. As mentioned above, the atomic percentage of silicon to germanium may be varied within each individual electrode layer. The layer 138 will bond tightly with layer 106 to form a single conductive and mechanical member.

In FIG. 8 a third photoresist layer 140 is deposited and patterned overlying the third electrode layer 138. A pattern of the third photoresist layer 140 corresponds to a width of the second electrode 146 and the anchor portion 150. As stated above, the pattern may be varied to achieve a desired final device arrangement and size.

In FIG. 9, portions of the first electrode layer 106, the second electrode layer 124, and the third electrode layer 138 are removed. The removal of the portions of the electrode layers re-exposes the top surface 118 of the first sacrificial layer 104. Boundaries of the remaining portions of the three electrode layers 106, 124, and 138 correspond to the pattern of the third photoresist layer 140 and the first portion 130, the second portion 132, and the third portion 134 of the second sacrificial layer 108.

An exterior boundary of the first portion 130 of the second sacrificial layer 108, shown as the leftmost edge, corresponds to an exterior surface 152 of the first suspended electrode 154. The first electrode 154 is further bounded by the first sacrificial layer 104 along a bottom surface and a first portion 122 of the third sacrificial layer along an interior surface.

An exterior boundary of the third photoresist layer 140, shown as the leftmost edge, corresponds to a first exterior surface 144 of the second electrode 146. Another boundary of the third photoresist layer 140, shown as the rightmost edge, corresponds to a second exterior surface 148 of the second electrode 146. As mentioned above, the dimensions of the third photoresist layer 140 may be varied to achieve specific dimensions of the final electrodes, see FIGS. 26 and 27 for examples of variations in shape and size.

Figure 16:
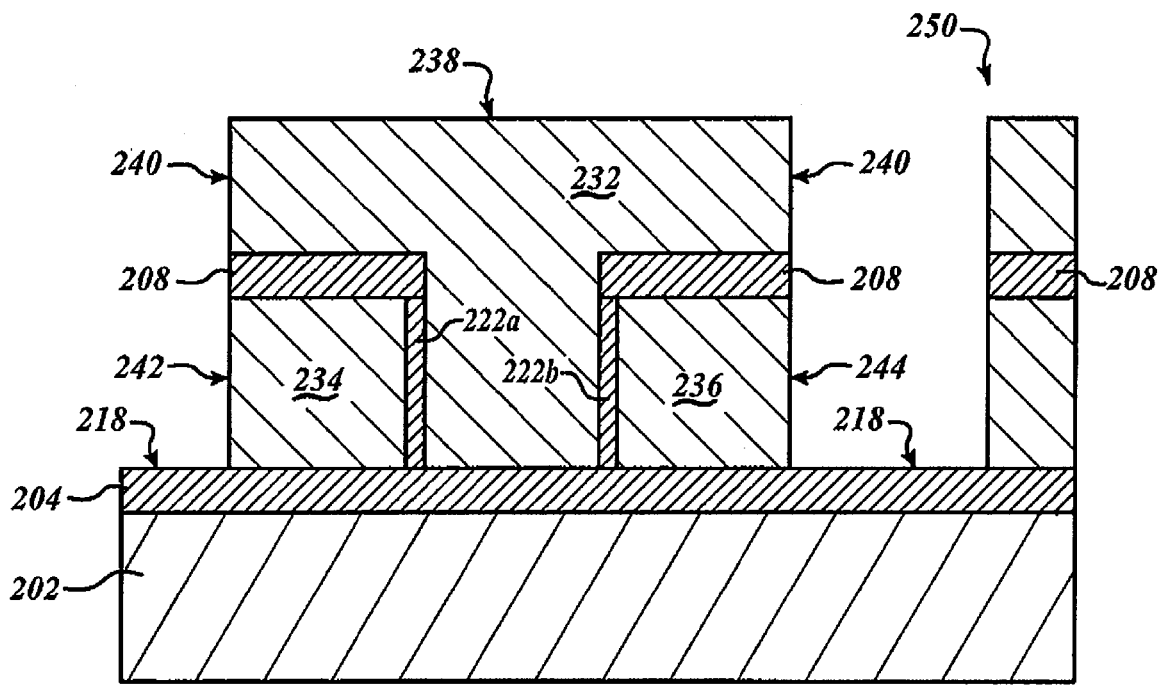
Figure 17:
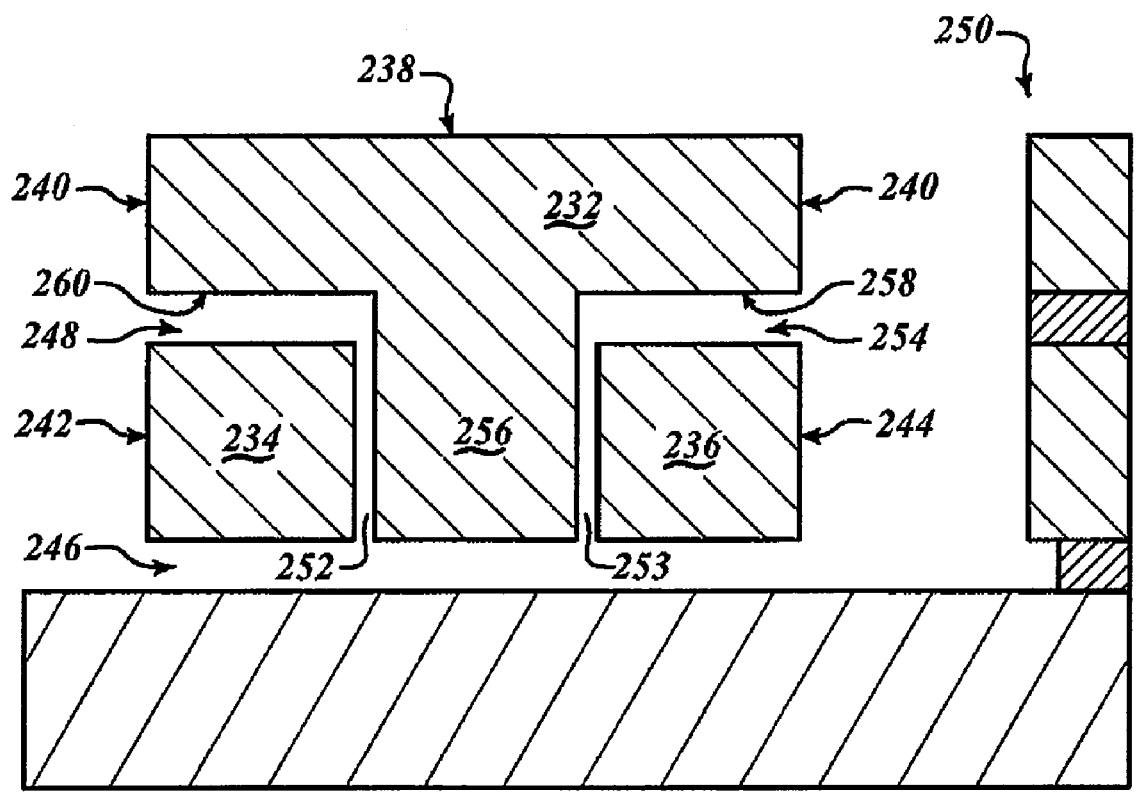

The first portion 130 of the second sacrificial layer 108 corresponds to the width of the suspended electrode 154. The second portion 132 of the second sacrificial layer 108 corresponds to a second portion 122b of the third sacrificial layer that is located between the second electrode layer 124 and a portion of the first electrode layer 106 that remains. The size of the second portion 132 of the second sacrificial layer 108 may be varied to completely separate the third electrode layer 138 from the first electrode layer 106, as accomplished by the first portion 130. FIGS. 16 and 17 also illustrate an alternative embodiment where the second portion 132 is larger. Other positions and arrangements of the second sacrificial layer 108 may be used to achieve specific device parameters.

The second electrode 146 has the first exterior surface 144 that extends over a part of the suspended electrode 154. The second exterior surface 148 is a combination of electrode layers, i.e., the first electrode layer 106 followed by the third electrode layer 138. The second exterior surface 148 is separated from the anchor portion 150 by a selected distance that may be varied based on the desired device parameters. In an alternative embodiment, the anchor portion 150 may not be visible in the cross section as illustrated.

Optionally, after removing the photoresist layer 140 the exposed surfaces of the first electrode layer 106 and the third electrode layer 138 may be oxidized. For example, an oxide layer may be deposited on all exposed surfaces of the first electrode 106 and the third electrode 138. The oxide may be deposited 5000 Angstroms thick. The oxide can be used to clean up surface defects of the silicon germanium surfaces.

In FIG. 10, portions the first sacrificial layer 104, the first portion 130 and the second portion 132 of the second sacrificial layer 108, and the third sacrificial layer 122 are removed with a suitable etch technique. The removal of the first sacrificial layer 104 creates a first opening 156 that separates the first suspended electrode 154 from the substrate 102. The first suspended electrode 154 is rigidly attached to the substrate 102 at a location that is not visible in this cross-section. The first suspended electrode 154 may be electrically coupled to the anchor portion 150 at the location where it is rigidly attached to the substrate 102. Alternatively, the first suspended electrode 154 may be rigidly attached to the substrate at a first location and a second location so that a portion of the suspended electrode 154 between to first and second locations is moveable.

The removal of the first portion 122a of the third sacrificial layer separates the first electrode 154 from the second electrode 146 in a horizontal direction by a second opening 158. The second portion 122b of the third sacrificial layer also corresponds to a third opening 160 between the second electrode layer 124 and the third electrode layer 138. The second opening 158 and the third opening 160 correspond to the width of the third sacrificial layer 122, which may be in the range of 10 to 100 nanometers. The high aspect ratio of these electrodes in conjunction with the minimal width of the opening 156 between these electrodes produces highly sensitive devices with significant design and processing flexibility.

The second electrode 146 is the combination of a portion of the first electrode layer 106, the second electrode layer 124, and the third electrode layer 138. These electrode layers may merge if the same atomic percentage is used in each deposition. The second electrode 146 is illustrated as suspended and is rigidly attached to the substrate 102 at a location not shown in this cross-section. In an alternative embodiment, the second electrode 146 may be attached to the substrate 102 along an entire bottom surface of the second electrode 146 (not shown). This may be achieved by additional pattern and etch steps earlier in the process so that the second electrode layer 124 is in contact with substrate instead of the first sacrificial layer 104.

The second electrode 146 forms an overhang 164 separated from the first electrode 154 in a vertical direction by a fourth opening 166 that corresponds to the first portion 130 of the second sacrificial layer 108. The fourth opening 166 connects to the second opening 158 so that two surfaces of the first electrode 154 may capacitively interact with two surfaces of the second electrode 146. The increased surface area created by the overhang 164 can increase the sensitivity of the capacitively coupled electrodes, the suspended electrode 154 and the second electrode 146.

The anchor portion 150 may be electrically coupled to the first suspended electrode 154 or the second electrode 146 or to a third voltage potential. Other anchor portions may be formed in the process so the electrodes are electrically connected to different anchors. Beneath the anchor portion 150, a portion 142 of the first sacrificial layer 104 remains to connect the anchor to the base. The anchor portion 150 is significantly larger than illustrated and the etch that removes the first sacrificial layer 104 is not long enough to remove all of the first sacrificial layer 104 that is under the anchor portion 150.

The suspended electrode 154 may be designed to respond to an acceleration force. When the predetermined acceleration force is applied to the MEMS device, the suspended electrode will deflect to electrically contact the second electrode 146. Alternatively, it can be driven by an oscillator or used in other MEMs type circuits. The change in distance between the electrodes will be sensed and may be transmitted through appropriate circuitry.

The properties of the MEMS device may be controlled during the design process to optimize device features. For example, the width and length of the suspended electrode 154 may be varied along with the width of the opening 158 between the two electrodes. Additionally, the weight and flexibility of the suspended electrode 154 may be selected to control the response of the device. The deflection distance of the suspended electrode 154 can be reasonably predicted based on the size parameters and material composition.

In an alternative embodiment, the suspended electrode 154 may be designed to respond to changes in temperature. Selection of materials with different thermal expansion coefficients for the suspended electrode and the second electrode can be configured to detect temperature variations. The close distances that can be achieved by this invention, on the range of 10 microns, permit uses of MEMs devices that were contemplated in the prior art.

By minimizing the width of the opening 158 between the first suspended electrode 154 and the second electrode 146 and maximizing the height to width ratio, the performance of the capacitively coupled electrodes improves. In addition, using SiGe for the electrodes allows variation of the Young's Modulus, i.e., the spring constant of the suspended electrode 154, without having to alter the physical size of the device.

FIGS. 11-17 illustrate an alternate process sequence to form a T-shaped electrode 232 that is capacitively coupled to a first and second suspended electrode 234 and 236, respectively (see FIG. 17). Two openings 252, 253 separate the T-shaped electrode 232 from the first and second suspended electrodes 234, 236.

Figure 11:
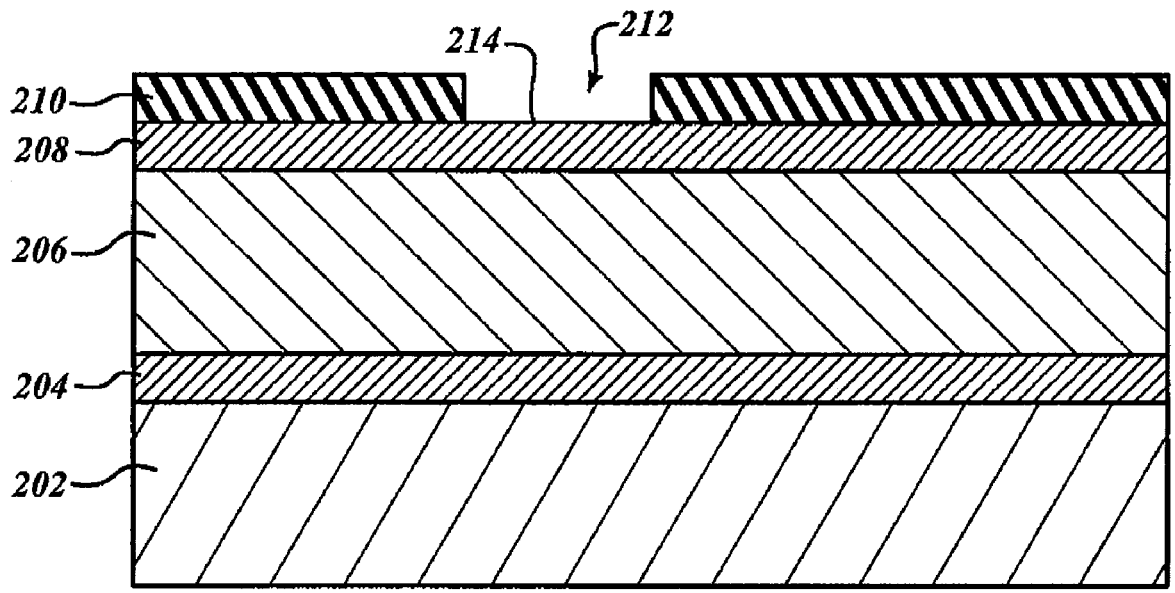
FIGS. 11-17 are cross-sectional views of different stages of an alternative manufacturing process of forming a first and second suspended electrode separated from a T-shaped electrode by an opening.

This alternate process begins with the same processes described above with respect to FIGS. 1-4. FIG. 11 shows a first sacrificial layer 204 deposited or grown on a substrate 202 and a first electrode layer 206 is deposited overlying the first sacrificial layer 204. The first electrode layer may be 20 microns or more in depth.

Subsequently, a second sacrificial layer 208 is grown or deposited overlying the first electrode layer 206. A first photoresist layer 210 is patterned and etched to define an opening 212 that exposes a portion of the top surface 214 of the second sacrificial layer 208. The opening 212 is wider than the opening 112 shown in FIG. 1. The increased width of opening 212 corresponds to a wider base (i.e., a lower portion 256) of the T-shaped electrode 232.

Figure 12:
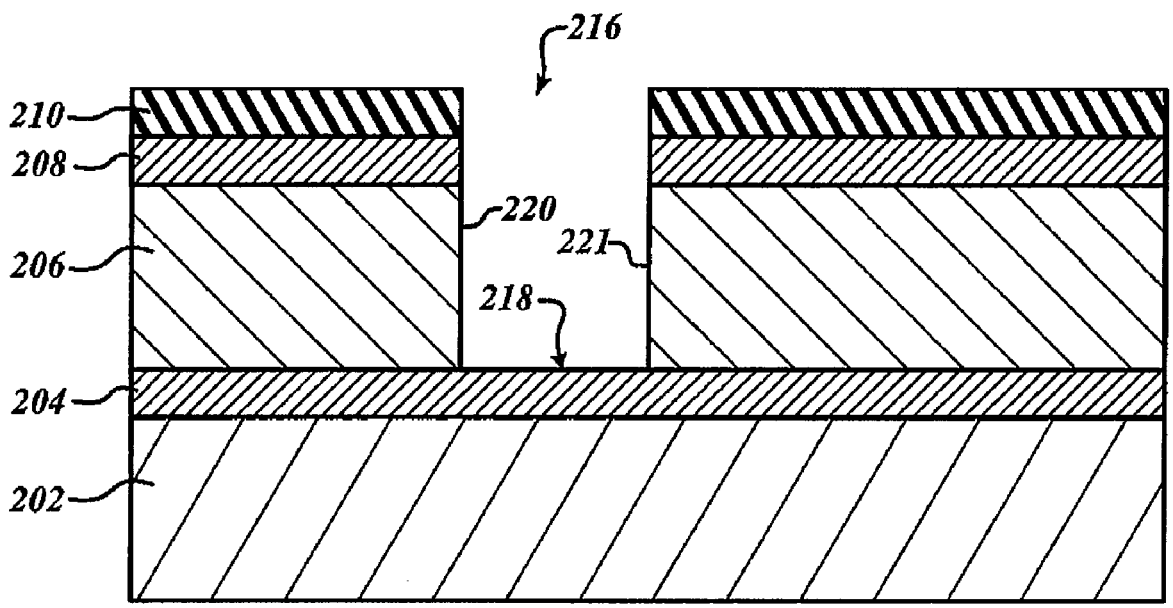
Figure 13:
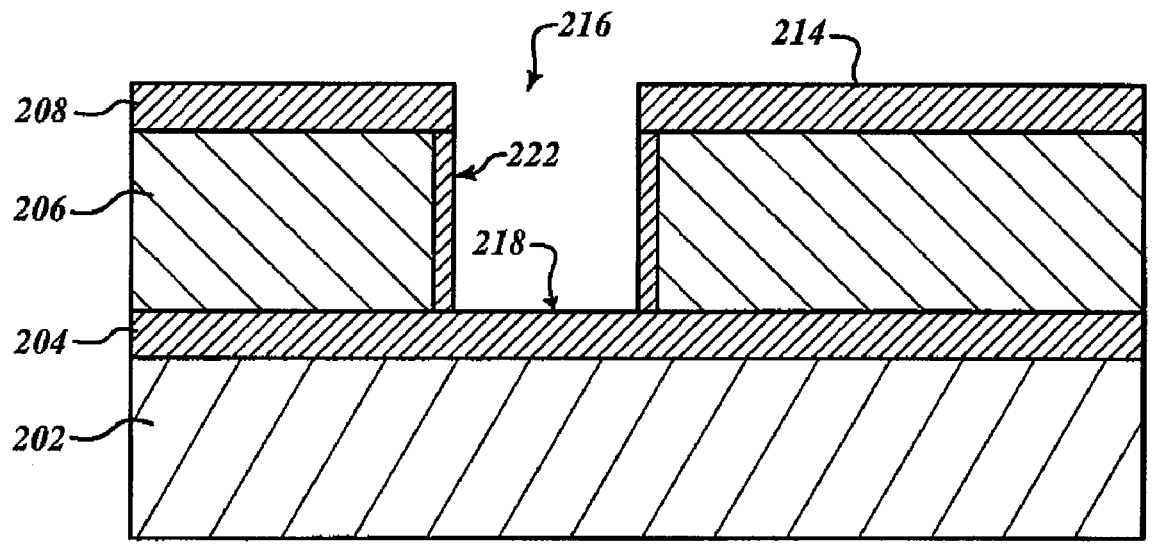

The second sacrificial layer 208 is etched corresponding to the width of the opening 212 and acts as a hard mask to form a recess 216, in FIG. 12. The recess 216 forms through the second sacrificial layer 208 and the first electrode layer 206 to expose a top surface 218 of the first sacrificial layer 204. In an alternative embodiment, the recess 216 may expose a top surface of the substrate 202 so that the T-shaped electrode 232 is rigidly attached to the substrate 202 along an entire bottom surface of the T-shaped electrode 232.

The recess 216 has a first wall 220 and a second wall 221 on opposing sides of the recess 216. The first and second wall 220, 221 are formed of exposed surfaces of the first electrode layer 206. A width of the recess 216 may be varied to meet specific design needs.

As with the process described in FIGS. 1-10, FIG. 13 shows a third sacrificial layer 222, 223 grown on the first and second walls 220, 221 of the first electrode layer 206. As described above, the third sacrificial layer 222 may be formed of the same material as the first and second sacrificial layers 204, 208, or of a different type of material that can be removed at a later stage of the process.

Figure 14:
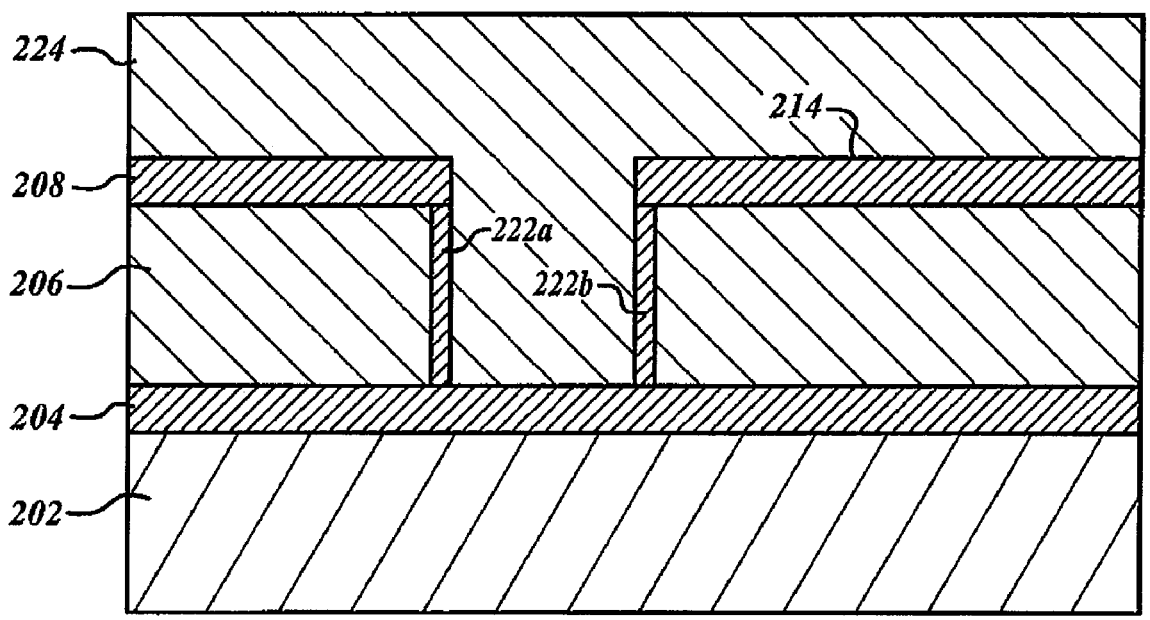

In FIG. 14, a second electrode layer 224 is deposited overlying the top surface 214 of the second sacrificial layer 208 and in the recess 216. As described above, the first and second electrode layers 206 and 224 may be formed of SiGe. The first and second electrode layers 206 and 224 may be of SiGe of the same atomic percentage or of a different atomic percentage.

In FIG. 15, a second photoresist layer 226 that is patterned to form the structure of the T-shaped electrode 232 and an anchor portion 250 to be formed later in the process. The anchor portion 250 is simply for illustrative purposes and may not be visible in this cross-section. The anchor portion 250 is illustrative that other features that electrically connect to the T-shaped electrode 232 and the suspended electrodes 234, 236 may be formed simultaneously with the electrodes.

A top surface 230 of the second electrode layer 224 is exposed by the photoresist layer 226 and corresponds to portions of the layers that will be removed. Additionally, the second photoresist layer 226 corresponds to exterior surfaces of the T-shaped electrode 232 and the first and second suspended electrodes 234, 236. The second photoresist layer 226 protects the layers beneath it as the exterior surfaces of the T-shaped electrode 232 and the first and second suspended electrodes 234, 236 are formed.

FIG. 16 shows electrode features that remain after portions of the second electrode layer 224, the second sacrificial layer 208, and the first electrode layer 206 are removed. The removal of the three layers re-exposes portions of the top surface 218 of the first sacrificial layer 204. After removing the second photoresist layer 226, a top surface 238 of the T-shaped electrode 232 that corresponds to the top surface 230 of the second electrode layer 224 is exposed. Upper exterior surfaces 240 of the T-shaped electrode 232 correspond to boundaries of the second photoresist layer 226. An exterior surface 242 of the first suspended electrode 234 and an exterior surface 244 of the second suspended electrode 244 also form when the upper surfaces 240 of the T-shaped electrode 232 form.

As described above, the first electrode layer 206 and the second electrode layer 224 may be formed of the same or of different materials. In one embodiment, the first and second electrode layers 206, 224 are both silicon germanium of the same atomic percentage. However, the first electrode layer 206 may be a silicon germanium deposition of a different atomic percentage than the second electrode layer 224. The atomic percentage of the silicon germanium deposition may also vary within the individual layers. The specific atomic percentages may be selected to optimize the Young's Modulus of the electrodes.

FIG. 17 shows the released T-shaped electrode 232 and the first and second suspended electrodes 234, 236. An etch technique removes portions of the first sacrificial layer 204 and the remaining portions of the second and third sacrificial layers 208, 222. In one embodiment, the sacrificial layers may be removed in different processes depending on the type of material used for the different layers. In another embodiment, periodic openings formed through the top surface 238 of the T-shaped electrode may align with and aid in the removal of the vertically arranged third sacrificial layer 222.

Removal of the first sacrificial layer 204 forms an opening 246 that separates the first and second suspended electrodes 234, 236 and the lower portion 256 of the T-shaped electrode 232 from the substrate 202. Removal of the second sacrificial layer 208 forms upper overhangs 258, 260 of the T-shaped electrode 232 that extend from the lower portion 256 over the first and second suspended electrodes 234, 236. An opening 248 separates the first suspended electrode 234 from the upper overhang 260 and another opening 254 separates the second suspended electrode 236 from the other upper overhang 258. A width of the openings 248, 254 correspond to the second sacrificial layer 208 and may be varied depending on design needs.

The first and second suspended electrodes 234, 236 are also separated from the T-shaped electrode in a horizontal direction by openings 252, 253, respectively. The openings 252, 253 correspond to the width of the third sacrificial layer 222, 223.

Having two surfaces of each of the first and second suspended electrodes 234, 236 capacitively coupled to the T-shaped electrode 232, i.e., the overhangs 258, 260, increases the amount of change in capacitance that can be registered and measured.

The anchor portion 250 remains attached to the substrate 202 by a portion 262 of the first sacrificial layer 204 that remains after removing the other portions. The first and second electrode may be electrically coupled and rigidly connected to the anchor portion 250 at a location not visible in this cross-section. In addition, the T-shaped electrode 232 may be rigidly attached to the substrate at a location not shown in this cross-section. Alternatively, as described above, the T-shaped electrode 232 may also be attached to the substrate 202 along the entire bottom surface so that the T-shaped electrode is not suspended.

FIGS. 18-28 illustrate an alternative process to form a suspended electrode 354 and a second electrode 346. As with the previously described embodiments, this third embodiment begins with forming a first sacrificial layer 304 on a top surface 318 of a substrate 302. The first sacrificial layer 304 may be any of the previously described materials that can be removed later in the process.

Figure 18:
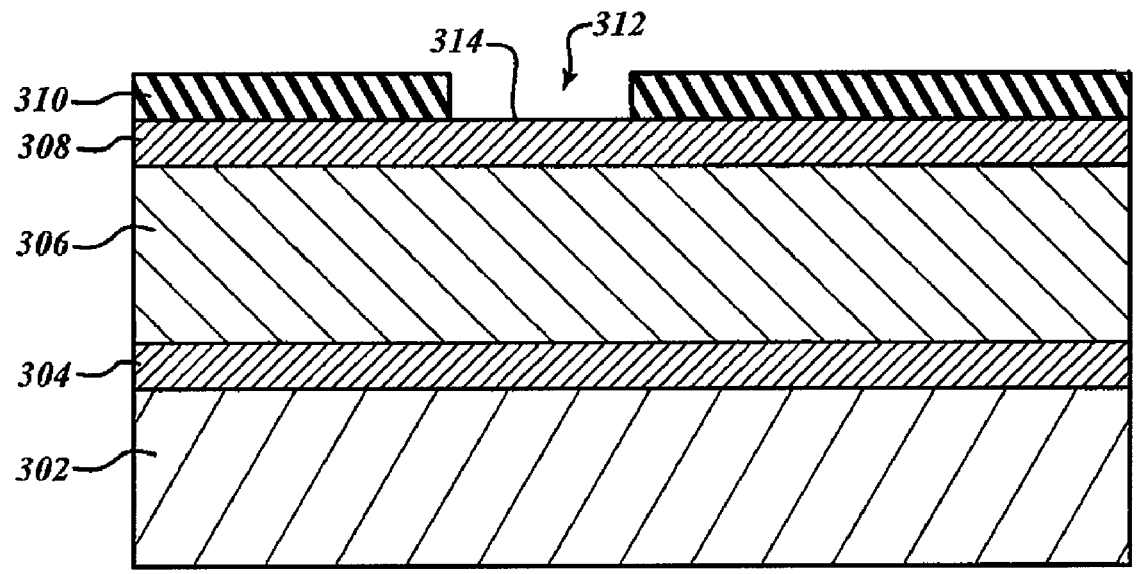
FIGS. 18-28 are cross-sectional views of different stages of yet another alternative manufacturing process of forming a first suspended electrode and a second electrode separated by an opening.

In FIG. 18, a first electrode layer 306 forms overlying the first sacrificial layer 304 and may be 20 microns or more in depth. The first electrode layer 306 corresponds to at least one surface of the suspended electrode 354. It may also correspond to at least one surface of the second electrode 346.

In one embodiment the first electrode layer 306 is formed of SiGe of a selected atomic percentage. Alternatively, the first electrode layer 306 may consist of several layers of SiGe of differing atomic percentages.

A second sacrificial layer 308 forms overlying the first electrode layer 306 and will act as a hard mask in forming some of the surfaces of the electrodes. A photoresist layer 310 forms overlying the second sacrificial layer 308 and is patterned to form the opening 312. A top surface 314 of the second sacrificial layer 308 is exposed by the opening 312.

Figure 19:
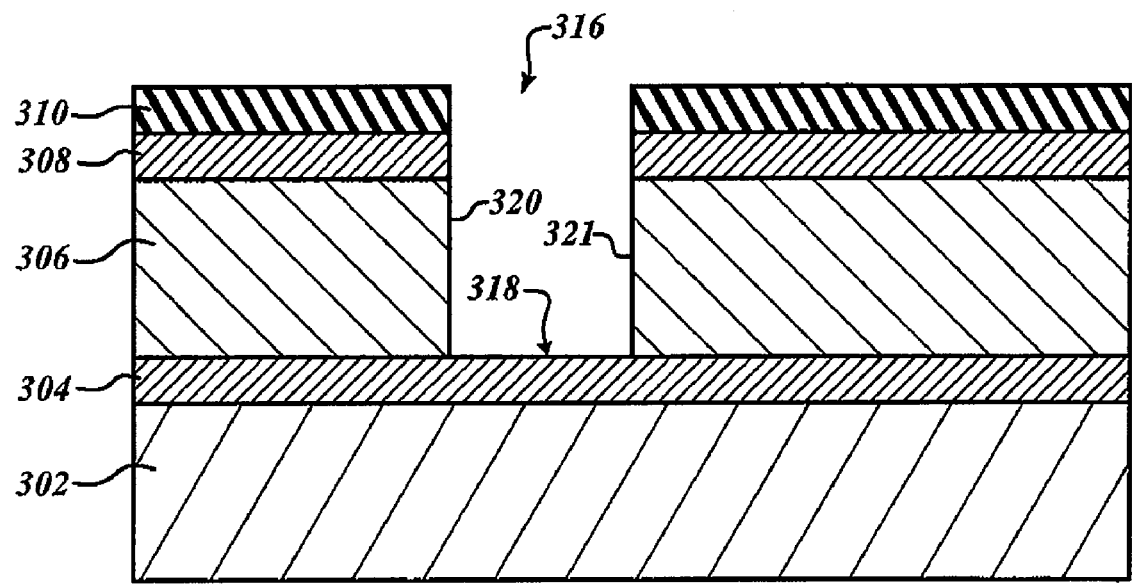

A width of the opening 312 determines a width of a recess 316 that forms as shown in FIG. 19. The recess 316 re-exposes the top surface 318 of the first sacrificial layer 304. The recess 316 has sidewalls 320, 321 of exposed surfaces of the first electrode layer 306.

In FIG. 20, a third sacrificial layer 322 forms in the recess and overlying the top surface 314 of the second sacrificial layer 308, the sidewalls 320, 321 of the first electrode layer 306, and the top surface 318 of the first sacrificial layer 304. The third sacrificial layer 322 is deposited rather than grown, as described above in FIGS. 1-10. A thickness of the third sacrificial layer 322 may be selected to form an opening 358 that is less than 100 nanometers. The opening 358, in FIG. 28, separates the suspended electrode 354 from the second electrode 346.

Figure 21:
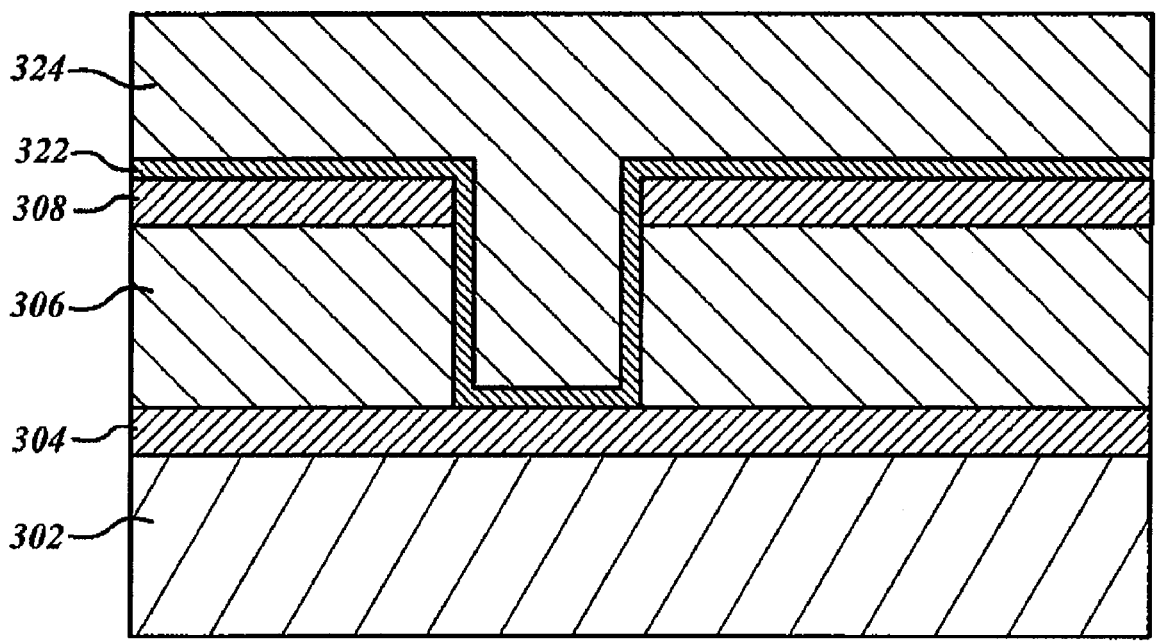
Figure 22:
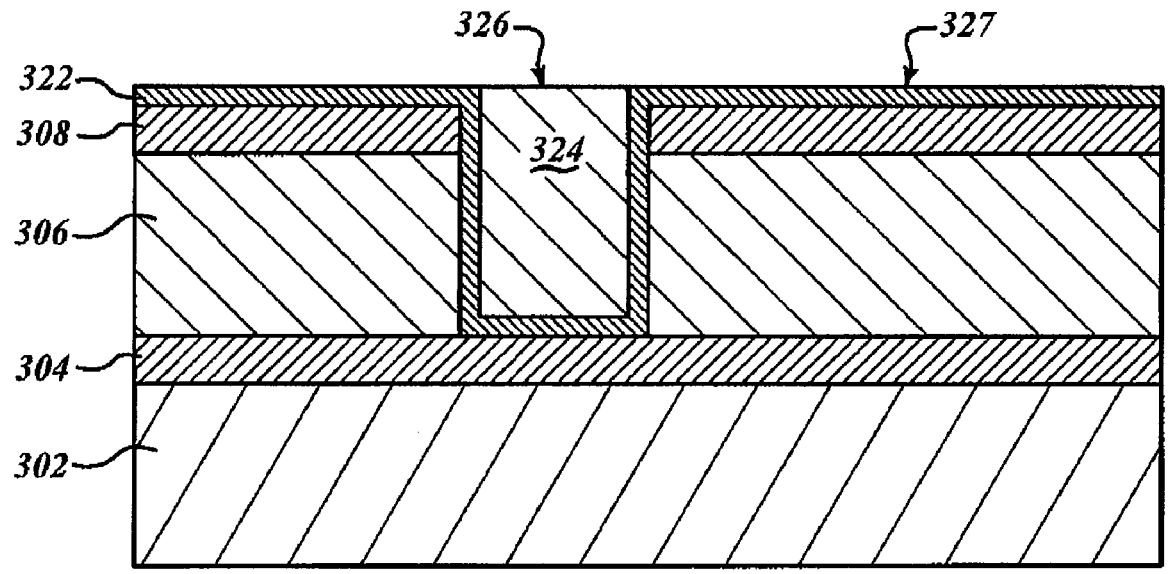

In FIG. 21, a second electrode layer 324 forms overlying the third sacrificial layer 322 on the second sacrificial layer 308 and in the recess 316. The second electrode layer 324 may be the same or of a different atomic percentage of SiGe than the first electrode layer 306. Subsequently, the second electrode layer 324 is planarized by chemical mechanical planarization so that at top surface 326 of the second electrode layer 324 is planar with a top surface 327 of the third sacrificial layer 322, see FIG. 22.

In FIG. 23, a second photoresist layer 328 is deposited and patterned. Portions of the second and third sacrificial layers 308 and 322 are etched based on the pattern of the second photoresist layer 328. Subsequently, the second photoresist layer 328 is removed.

Figure 24:
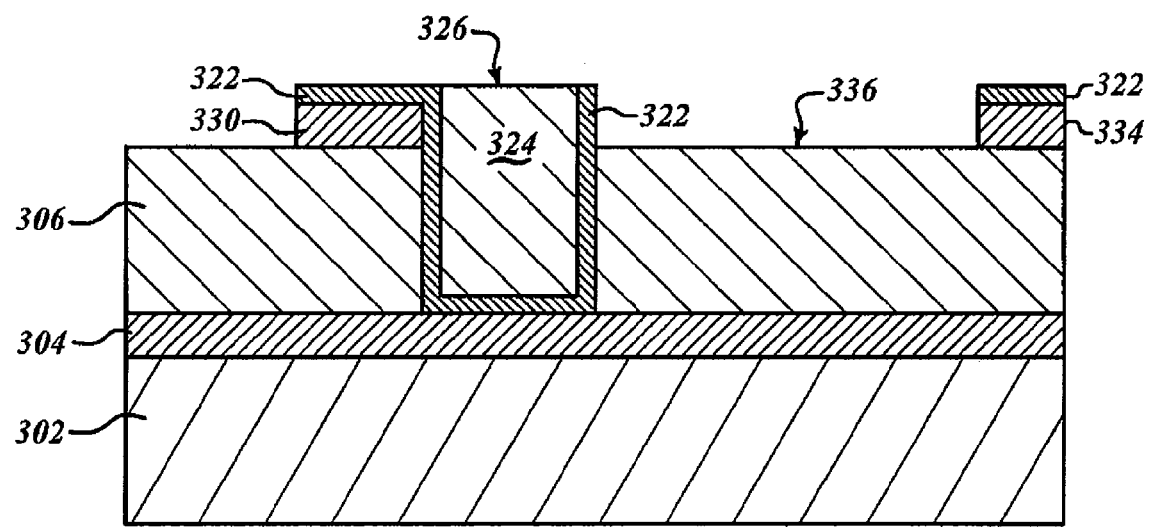
Figure 27:
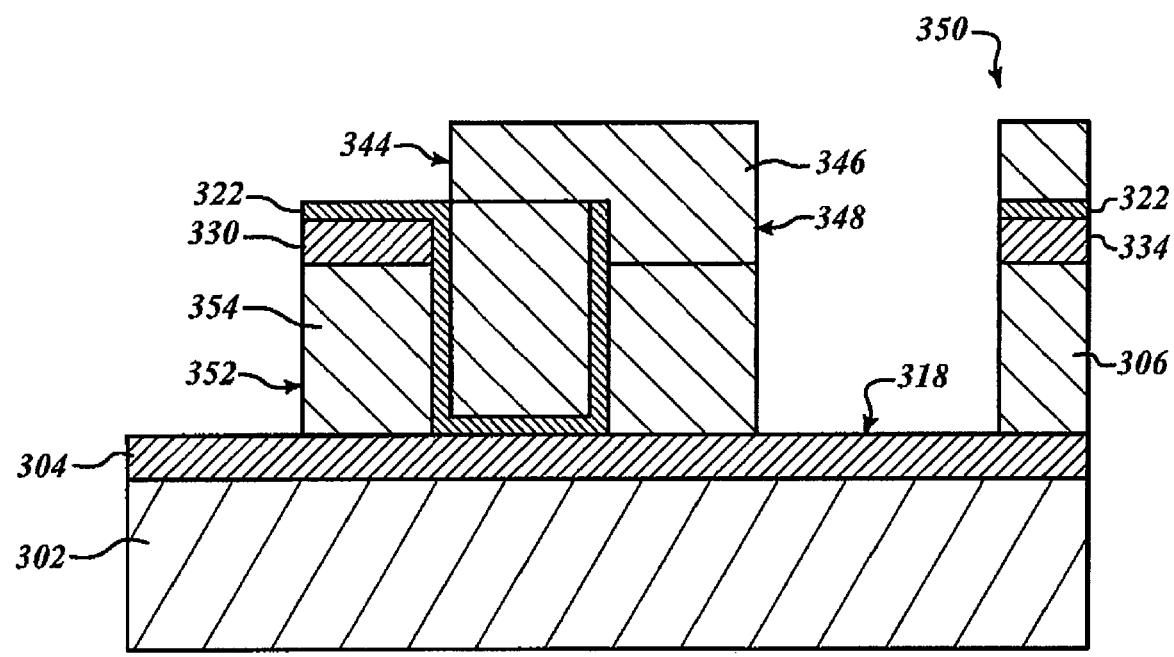
Figure 28:
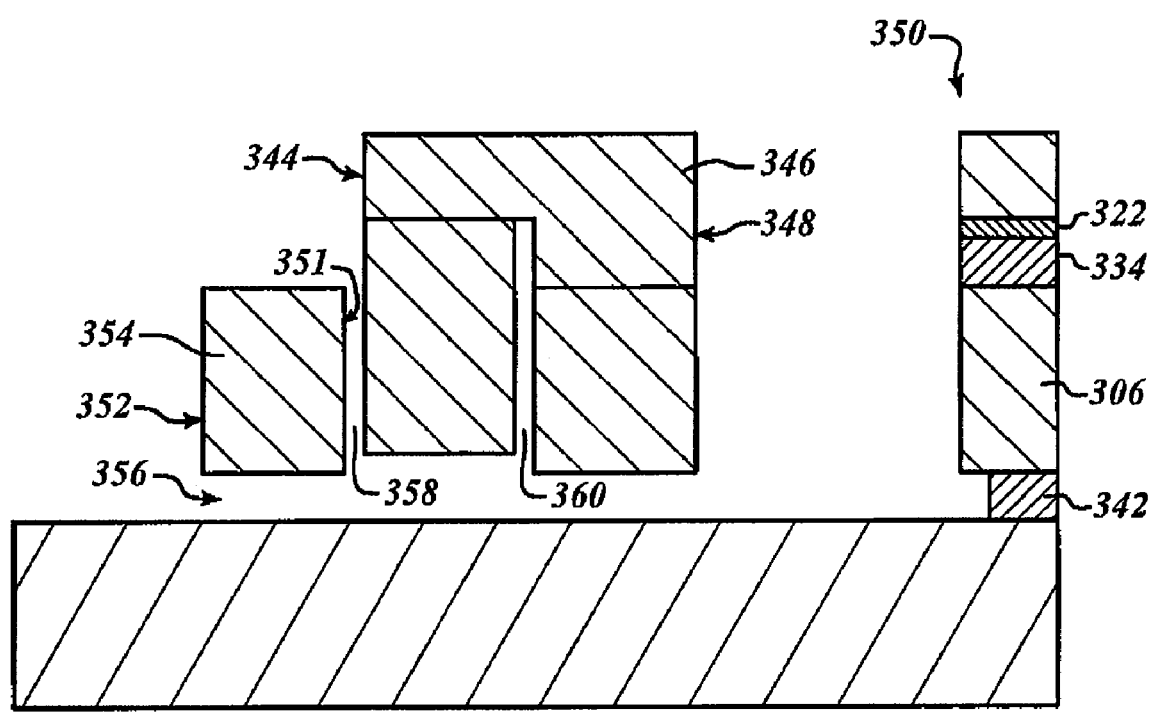

In FIG. 24, the remaining portions 330, 334 of the second sacrificial layer 308, which are covered by portions of the remaining third sacrificial layer 322, correspond to a width of the suspended electrode 354 and to an anchor portion 350, see FIGS. 27 and 28. The portion of the third sacrificial layer 322 that is adjacent the sidewalls 320, 321 of the first electrode layer 306 corresponds to the opening 358 and to another opening 360. The etched of the portions of the second sacrificial layer 308 and the third sacrificial layer 322 re-expose a top surface 336 of the first electrode layer 306 and the top surface 326 of the second electrode layer 324.

Figure 25:
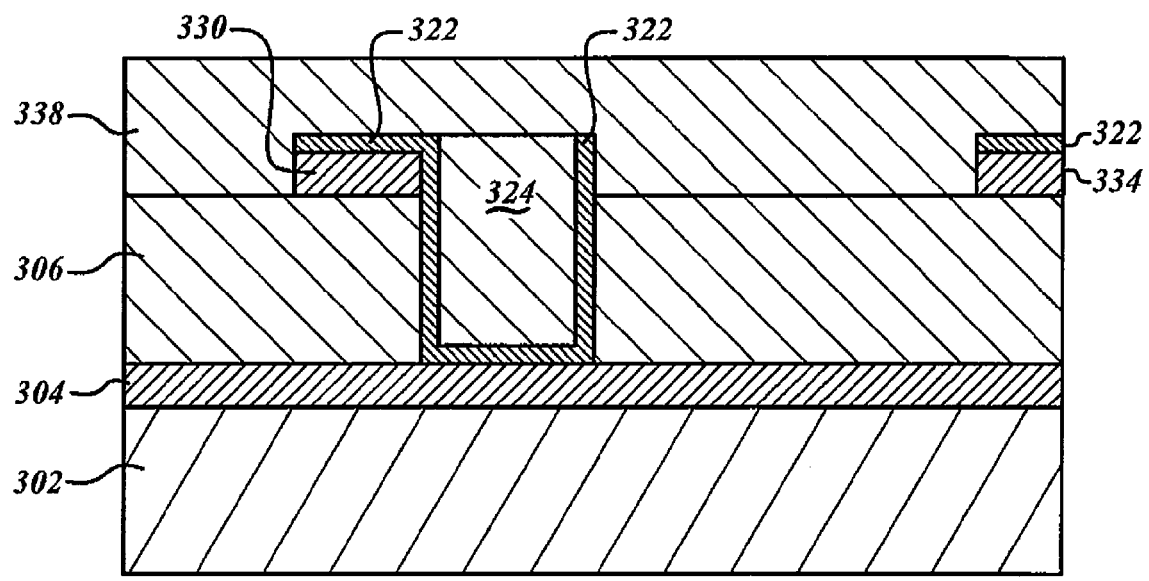

In FIG. 25, a third electrode layer 338 is deposited overlying the top surface 336 of the first electrode layer and the top surface 326 of the second electrode layer 324. The third electrode layer 338 may be of the same or of a different atomic percentage than the first and second electrode layers 306, 324 based on desired qualities and performance of the electrodes.

Figure 26:
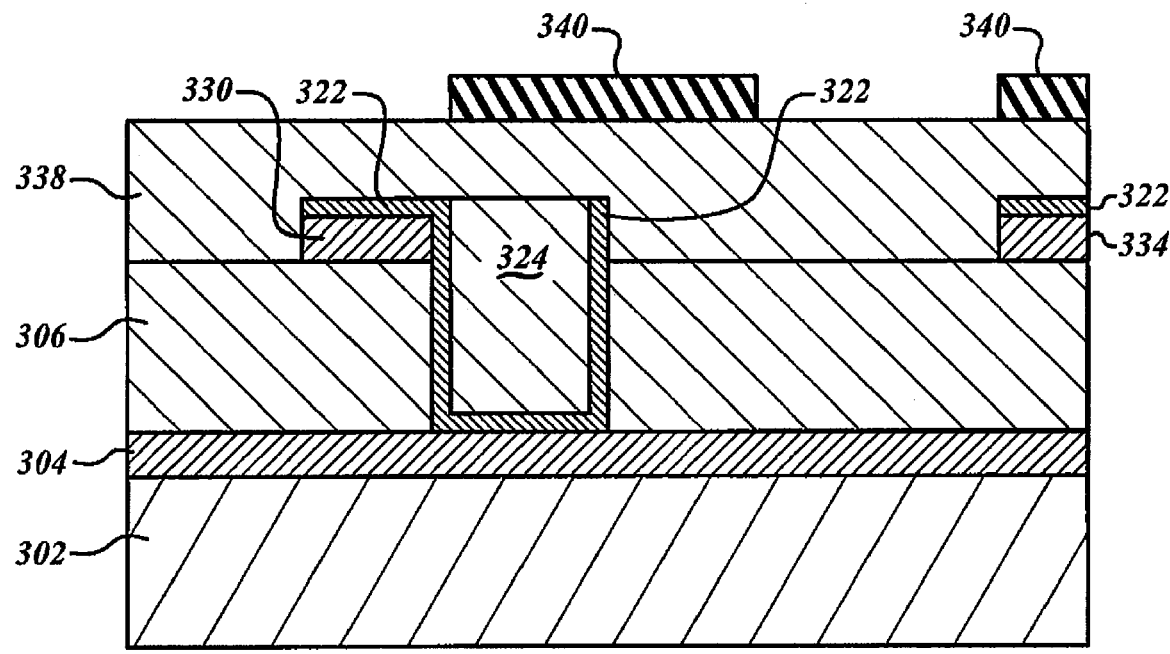

In FIG. 26, a third photoresist layer 340 is deposited and patterned overlying the third electrode layer 338. A position and size of the third photoresist layer 340 may be selected to achieve a desired shape of the second electrode 346. In this embodiment, one boundary of the third photoresist layer 340 aligns with an interior surface of the third sacrificial layer 322 that formed adjacent the sidewalls 320, 321 of the first electrode layer 306. By aligning the third photoresist layer 340 with the interior surface of the third sacrificial layer 322, no over hang will form when the sacrificial layers are later removed.

Another boundary of the third photoresist layer 340 extends overlying the first and third electrode layers 306, 338 that are stacked together and not separated by any other materials. This boundary corresponds to an exterior surface 348 of the second electrode 346 and may be varied to achieve a desired width of the second electrode 346.

Another portion of the patterned third photoresist layer 340 aligns with the anchor portion 350 previously defined by the remainder of the second and third sacrificial layers 334, 322, respectively.

As shown in FIG. 27, portions of the first and third electrode layers 306 and 338 are removed by a suitable etch technique. An exterior surface 352 of the suspended electrode 354 is exposed when portions of the first electrode layer 306 are removed based on the width of the remaining portion 330 of the second sacrificial layer 308. An upper exterior surface 344 of the second electrode 346 is also exposed when the third electrode layer 338 is removed based on of the boundaries of the third photoresist layer 340. The removal of the portions of the first and third electrode layers 306, 338 re-expose the top surface 318 of the first sacrificial layer 304.

Subsequently, as shown in FIG. 28, the suspended electrode 354 and the second electrode 346 are released by an etch suitable to remove portions of the first, second, and third sacrificial layers 304, 330, and 322. The opening 358 separates the suspended electrode 354 from the second electrode 346. The surface 344 of the second electrode 346 is substantially parallel to a surface 351 of the suspended electrode 354. The second electrode 346 may be a sensing body that registers a change in the capacitance between it and the suspended electrode 354. The opening 360 between portions of the second electrode 346 corresponds to the thickness of the third sacrificial layer 322.

Another opening 356 below the suspended electrode 354 and the second electrode 346 separates these electrodes from the substrate 302. The electrodes may be rigidly attached to the substrate 302 at separate locations not visible in the cross-section. In addition, one of the electrodes is electrically connected to the anchor portion 250. The other electrode may then be electrically connected to a different anchor portion not shown in this cross-section.

Additionally or alternatively, the second electrode 346 may be rigidly attached to the substrate 302 along an entire bottom surface of the second electrode, rather than being separated from the substrate 302 by the opening 356. This may be achieved by a longer etch when forming the recess 316 in FIG. 19 so that the second electrode layer 324 may be formed on a top surface of the substrate 302.

After etching the portions of the first, second, and third sacrificial layers 304, 330, and 322 a portion 342 of the first sacrificial layer 304 remains under the anchor portion 350. Generally, the anchor portion 350 is significantly larger than the suspended electrode 354. Therefore the length of the etch to release the suspended electrode 354 is not long enough to completely remove the oxide beneath the anchor portion 350. The remaining portion 342 secures the anchor portion 350 to the substrate 302.

Various embodiments of 1, 2 and 3 suspended electrodes are disclosed. Of course, each electrode may have multiple fingers, some of which are interdigitated with each other. Alternatively, many separate electrode members, in the dozens or hundreds, can be formed, each having a desired shape. While cross-sections have been shown, the top side geometry can be any one of many accepted shapes, including spring members, weighed areas, vibrating portions and the like as are well known in the art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a first opening between a first electrode and a second electrode, the forming comprising:
      forming a first electrode layer overlying a substrate;
      forming a first sacrificial layer overlying the first electrode layer;
      forming a second opening in the first sacrificial layer;
      forming a recess in the first electrode layer through the second opening, the recess having sidewalls;
      forming a second sacrificial layer on the sidewalls of the recess and overlying the first sacrificial layer, the second sacrificial layer having a first width that corresponds to a second width of the first opening;
      forming a second electrode layer in the recess;
      removing portions of the first and second sacrificial layer to expose a top surface of the first electrode layer;
      forming a third electrode layer overlying remaining portions of the first and second sacrificial layers, overlying the second electrode layer, and overlying the top surface of the first electrode layer;
      forming the first electrode and the second electrode by removing portions of the first and third electrode layers, the second electrode including portions of the second electrode layer and the third electrode layer; and
      releasing the first electrode from the second electrode by removing portions of the first and second sacrificial layers to form the first opening.

2. The method of claim 1, further comprising forming the first electrode layer, the second electrode layer, and the third electrode layer from silicon germanium.

3. The method of claim 2, further comprising selecting an atomic ratio of silicon to germanium to achieve a selected target spring constant for the first electrode.

4. The method of claim 1, further comprising:
   forming the first electrode layer from silicon germanium having a first atomic ratio; and
   forming the second electrode layer and the third electrode layer from silicon germanium having a second atomic ratio that is different from the first atomic ratio.

5. The method of claim 1 wherein the second electrode layer includes silicon germanium having a first atomic ratio and the third electrode layer includes silicon germanium having a second atomic ratio different than the first atomic ratio.

6. The method of claim 1, further comprising:
   forming an anchor portion of the first electrode attached to a substrate; and
   forming a moveable portion of the first electrode separated from the substrate by a third opening.

7. The method of claim 6, further comprising:
   forming a third sacrificial layer prior to forming the first electrode layer, the third sacrificial layer having a first height that corresponds to a second height of the third opening; and
   removing the third sacrificial layer concurrently with the first and second sacrificial layers to form the first and third openings.

8. The method of claim 6, further comprising forming an anchor portion of the second electrode attached to the substrate.

9. The method of claim 6, further comprising:
   forming an anchor portion of the second electrode attached to the substrate; and
   forming a moveable portion of the second electrode separated from the substrate by the third opening that also separates the first electrode from the substrate.

10. The method of claim 1 wherein the first electrode layer is at least 20 microns tall and the first opening between the first electrode and the second electrode is less than 1 micron.

11. A MEMS device, comprising:
    a first and a second suspended silicon germanium electrode, each electrode having a height and separated from a substrate by a first distance, the first and second suspended electrodes each having a first surface orthogonal to a second surface; and
    a third silicon germanium electrode having a first portion formed between the first and second suspended electrodes, the first portion having a first and a second surface separated from the first surfaces of the first and second suspended electrodes by a second distance, wherein a ratio of the height of the first and second suspended electrode to the second distance is greater than 20:1, the third electrode having a second portion having a third and fourth surface separated from the second surfaces of the first and second electrodes by a third distance.

12. The MEMS device of claim 11 wherein the first and second suspended electrodes have a first atomic ratio of silicon to germanium and the third electrode has a second atomic ratio of silicon to germanium.

13. The MEMS device of claim 11 wherein the first and second suspended electrodes and the third electrode have a same atomic ratio of silicon to germanium.

14. The MEMS device of claim 11 wherein the third electrode is formed of more than layer of silicon germanium having different ratios of silicon to germanium.

15. The device of claim 11 wherein the second distance is different from the third distance.

16. A method of forming a MEMS device, comprising:
    forming a first sacrificial layer overlying a substrate;
    forming a first electrode layer overlying the first sacrificial layer;

forming a second sacrificial layer overlying the first electrode layer;

forming a recess in the first electrode layer through the second sacrificial layer, the recess having sidewalls that correspond to an interior surface of a suspended electrode;

forming a third sacrificial layer having a first width adjacent the sidewalls;

forming a second electrode layer in the recess adjacent to the third sacrificial layer and overlying the second sacrificial layer, the second electrode layer corresponding to a second electrode;

forming the suspended electrode and the second electrode by removing portions of the first electrode layer and the second electrode layer; and releasing the suspended electrode from the second electrode by removing portions of the first sacrificial layer, the second sacrificial layer, and the third sacrificial layer, the suspended electrode separated from the second electrode by a second width that corresponds to the first width of the third sacrificial layer.

17. The method of claim 16, further comprising:
exposing a first surface of the first sacrificial layer when forming the recess in the first electrode layer; and
forming the second electrode layer overlying the first surface of the first sacrificial layer.

18. The method of claim 16, further comprising:
exposing a first surface of the substrate when forming the recess in the first electrode layer; and
forming the second electrode layer overlying the first surface of the substrate.

19. The method of claim 16, further comprising forming the first electrode layer and the second electrode layer from silicon germanium.

20. The method of claim 16, further comprising:
forming the first electrode layer having a first atomic ratio of silicon to germanium; and
forming the second electrode layer having a second atomic ratio of silicon to germanium.

21. The method of claim 16, further comprising forming the second electrode layer by depositing more than one layer of silicon germanium having different atomic ratios.

22. The method of claim 16, further comprising:
forming a moveable section of the suspended electrode; and
forming an anchor section of the suspended electrode, the anchor section attached to the substrate by an anchor portion of the first sacrificial layer that remains after removing the portions of the first sacrificial layer.

23. A method of forming capacitively coupled electrodes separated by an opening, the method comprising:
forming a first sacrificial layer overlying a substrate;
forming a first electrode layer overlying the first sacrificial layer;
forming a recess in the first electrode layer, the recess having sidewalls that correspond to a first surface of a first electrode;
forming a second sacrificial layer overlying the first electrode layer including overlying the sidewalls of the recess, the second sacrificial layer having a first width that corresponds to a second width of the opening;
forming a second electrode layer overlying the second sacrificial layer and in the recess;
forming the first electrode and a second electrode by concurrently removing portions of the first electrode layer and the second electrode layer; and
forming the opening between the first electrode and the second electrode by removing portions of the first and second sacrificial layer.

24. The method of claim 23 wherein a first surface of the second electrode layer adjacent the sacrificial layer in the recess corresponds to the first surface of the at least one first electrode.

25. The method of claim 24 wherein a second surface of the first electrode is transverse to the first surface of the first electrode and a second surface of the second electrode layer corresponds to the second surface of the first electrode.

26. The method of claim 25 wherein removing the portions of the sacrificial layer forms a first portion of the opening between the first surface of the first electrode and the first surface of the second electrode and a second portion of the opening between the second surface of the first electrode and the second surface of the second electrode, the first portion of the opening transverse to the second portion of the opening.

* * * * *